(12) United States Patent
Nakamura et al.

(10) Patent No.: US 9,991,220 B2
(45) Date of Patent: Jun. 5, 2018

(54) SEMICONDUCTOR DEVICE

(71) Applicant: FUJI ELECTRIC CO., LTD., Kawasaki-shi, Kanagawa (JP)

(72) Inventors: Yoko Nakamura, Matsumoto (JP); Norihiro Nashida, Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days. days.

(21) Appl. No.: 14/850,274

(22) Filed: Sep. 10, 2015

(65) Prior Publication Data

US 2015/0380374 A1 Dec. 31, 2015

Related U.S. Application Data

(63) Continuation of application No. PCT/JP2014/065589, filed on Jun. 12, 2014.

(30) Foreign Application Priority Data

Jun. 19, 2013 (JP) ................................. 2013-128409

(51) Int. Cl.
*H05K 7/00* (2006.01)
*H01L 23/00* (2006.01)
(Continued)

(52) U.S. Cl.
CPC .............. *H01L 24/32* (2013.01); *H01L 24/01* (2013.01); *H01L 24/33* (2013.01);
(Continued)

(58) Field of Classification Search
CPC . H01L 2924/00012; H01L 2924/13055; H01L 2924/13091; H01L 2924/181;
(Continued)

(56) References Cited

U.S. PATENT DOCUMENTS 3,923,609 A * 12/1975 Welch .................. B23K 35/001
156/151
5,041,901 A * 8/1991 Kitano .............. H01L 23/49582
257/669
(Continued)

FOREIGN PATENT DOCUMENTS

JP H03-072662 A 3/1991
JP H04-142765 A 5/1992
(Continued)

OTHER PUBLICATIONS

PCT, "International Search Report for International Application No. PCT/JP2014/065589".

*Primary Examiner* — Yuriy Semenenko
(74) *Attorney, Agent, or Firm* — Manabu Kanesaka

(57) ABSTRACT

The semiconductor device includes an insulating substrate including an insulating plate and a circuit plate; a semiconductor chip having a front surface formed with an electrode and a rear surface fixed to the circuit plate; a printed circuit board including a metal layer, and facing the insulating substrate; a conductive bonding material disposed on the electrode; and a conductive post having a leading end portion electrically and mechanically connected to the electrode through the bonding material, a base portion electrically and mechanically connected to the metal layer, and a central portion. In the conductive post, a wetting angle of a surface of the leading end portion with respect to the molten bonding material is less than the wetting angle of a surface of the central portion.

8 Claims, 7 Drawing Sheets

(51) Int. Cl.
*H01L 25/07* (2006.01)
*H01L 25/18* (2006.01)
*H01L 25/065* (2006.01)
*H05K 1/18* (2006.01)
*H05K 3/34* (2006.01)

(52) U.S. Cl.
CPC .......... *H01L 25/0655* (2013.01); *H01L 25/07* (2013.01); *H01L 25/18* (2013.01); *H05K 1/181* (2013.01); *H05K 3/341* (2013.01); *H01L 2224/28105* (2013.01); *H01L 2224/29111* (2013.01); *H01L 2224/29139* (2013.01); *H01L 2224/32113* (2013.01); *H01L 2224/32225* (2013.01); *H01L 2224/32258* (2013.01); *H01L 2224/33181* (2013.01); *H01L 2924/1203* (2013.01); *H01L 2924/13055* (2013.01); *H01L 2924/13091* (2013.01); *H01L 2924/1431* (2013.01); *H01L 2924/181* (2013.01); *H01L 2924/351* (2013.01)

(58) Field of Classification Search
CPC ..... H01L 2924/351; H01L 2224/28105; H01L 2224/29111; H01L 2224/29139; H01L 2224/32113; H01L 2224/32225; H01L 2224/32258
See application file for complete search history.

(56) References Cited

U.S. PATENT DOCUMENTS

| | | | | |
|---|---|---|---|---|
| 6,307,161 | B1* | 10/2001 | Grube | H01L 23/49811 |
| | | | | 174/260 |
| 7,888,173 | B2 | 2/2011 | Taniguchi et al. | |
| 8,299,620 | B2* | 10/2012 | Tanaka | H01L 23/49524 |
| | | | | 257/691 |
| 8,410,591 | B2* | 4/2013 | Otremba | H01L 23/4952 |
| | | | | 257/676 |
| 9,035,438 | B2* | 5/2015 | Hayashi | H01L 23/34 |
| | | | | 257/666 |
| 9,059,153 | B2* | 6/2015 | Fukui | H01L 23/49513 |
| 9,095,054 | B1* | 7/2015 | Bourne | H01L 25/165 |
| 9,275,938 | B1* | 3/2016 | McPherson | H01L 23/051 |
| 9,407,251 | B1* | 8/2016 | Passmore | H05K 1/0243 |
| 2008/0179076 | A1* | 7/2008 | Ju | C25D 5/12 |
| | | | | 174/126.2 |
| 2009/0246910 | A1 | 10/2009 | Taniguchi et al. | |
| 2010/0027228 | A1 | 2/2010 | Tsukada et al. | |
| 2015/0380393 | A1* | 12/2015 | Nakamura | H01L 24/01 |
| | | | | 361/782 |

FOREIGN PATENT DOCUMENTS

| | | |
|---|---|---|
| JP | H06-013523 A | 1/1994 |
| JP | H11-040700 A | 2/1999 |
| JP | 2009-064852 A | 3/2009 |
| JP | 2009-231690 A | 10/2009 |
| JP | 2009231690 A | 10/2009 |
| JP | 2010-041053 A | 2/2010 |
| JP | 2011-009533 A | 1/2011 |
| JP | 2012-129336 A | 7/2012 |

* cited by examiner

Prior Art

Prior Art

Prior Art

_US 9,991,220 B2_

SEMICONDUCTOR DEVICE

CROSS-REFERENCES TO RELATED APPLICATIONS

The present application is a Continuation Application of PCT International Application No. PCT/JP2014/065589 filed Jun. 12, 2014, and claiming priority from Japanese Application No. 2013-128409 filed Jun. 19, 2013, the disclosure of which is incorporated herein.

TECHNICAL FIELD

The present invention relates to a semiconductor device, and more particularly, to a power semiconductor module including a power semiconductor chip.

BACKGROUND ART

FIGS. 5(a), 5(b) are diagrams illustrating the structure of a power semiconductor module 500 according to the related art. FIG. 5(a) is a cross-sectional view illustrating a main portion and FIG. 5(b) is a cross-sectional view illustrating the main portion taken along the line V-V in FIG. 5(a).

The power semiconductor module 500 includes an insulating substrate 104, semiconductor chips 106, a printed circuit board 109, and conductive posts 108.

The rear surface of the semiconductor chip 106 is fixed to a circuit plate 103 of the insulating substrate 104 through a conductive bonding material 105 such as solder. A base portion of the conductive post 108 is electrically and mechanically connected to a metal layer 114 of the printed circuit board 109. In addition, the leading end of the conductive post 108 is electrically and mechanically connected to a front electrode of the semiconductor chip 106 through the conductive bonding material 107 such as solder.

The power semiconductor module 500 further includes external terminals 110 and a sealing resin 111.

The power semiconductor module 500 has a structure in which electrical wiring to a rear electrode (not illustrated) of the semiconductor chip 106 is performed by the circuit plate 103 and electrical wiring to the front electrode (not illustrated) is performed by the conductive post 108 and the printed circuit board 109 (for example, see Patent Document 1).

A process of manufacturing the power semiconductor module 500 is as follows. First, a bonding material 105 is placed on the insulating substrate 104 and the semiconductor chip 106 is placed on the bonding material 105. In addition, the bonding material 107 is placed on the semiconductor chip 106. Then, the external terminal 110 is inserted into a concave portion 112 which is provided in the circuit plate 103 of the insulating substrate 104. Then, the printed circuit board 109 to which the conductive posts 108 have been fixed in advance is placed at a position that faces the insulating substrate 104 while the external terminals 110 are being inserted into through holes 113. The bonding materials are melted and reflow in, for example, a $N_2.H_2$ gas to collectively assemble these components. Finally, the assembly is sealed by the insulating resin 111 (for example, see Patent Document 2).

CITATION LIST

Patent Document

Patent Document 1: JP 2009-64852 A
Patent Document 2: JP 2012-129336 A

DISCLOSURE OF THE INVENTION

Problem to be Solved by the Invention

The leading end of the conductive post 108 is fixed to the semiconductor chip 106 by the bonding material 107. However, when the amount of bonding material 107 is greater than a predetermined value, the bonding material 107 rises to a central portion of the conductive post 108 due to a capillary phenomenon during a reflow process. As a result, in some cases, the bonding material 107 reaches the printed circuit board 109 and the conductive post 108 is covered with the bonding material 107. FIG. 6(a) is a schematic diagram illustrating that case.

When the conductive post 108 is made of copper, the linear expansion coefficient of the conductive post 108 is about $16.5 \times 10^{-6}$ (1/° C.). When the bonding material 107 is solder, the linear expansion coefficient of the bonding material 107 is in the range of about $22.0 \times 10^{-6}$ (1/° C.) to $24.0 \times 10^{-6}$ (1/° C.). When the semiconductor chip 106 operates to generate heat in the state illustrated in FIG. 6(a) and an ambient temperature increases, thermal stress is generated in a direction in which the conductive post 108 is vertically strained due to the difference between the linear expansion coefficients of copper and solder. Then, as illustrated in FIG. 6(b), the thermal stress is applied to the semiconductor chip 106, which causes the damage of the semiconductor chip 106.

FIGS. 7(a), 7(b) illustrate the photographs of the surface of the semiconductor chip 106 before and after a reliability test. FIG. 7(a) illustrates the photograph before the test and FIG. 7(b) illustrates the photograph after the test. As can be seen in FIG. 7(b), the semiconductor element is unevenly deformed and damaged after the reliability test.

In a power semiconductor module including a wide band gap (WBG) chip, such as a SiC chip, which has been applied in recent years, the range of an operation temperature is wider than that of a power semiconductor module including a Si chip according to the related art (for example, Tjmax>175° C.). Therefore, in the power semiconductor module including the WBG chip, the thermal stress further increases. As a result, the concern that reliability will be reduced increases.

The invention has been made in view of the above-mentioned problems and an object of the invention is to provide a semiconductor device that can reduce thermal stress applied to a semiconductor chip and improve reliability in a power semiconductor module in which the semiconductor chip is electrically wired by a printed circuit board and a conductive post.

Means for Solving Problem

In order to achieve the object, according to an aspect of the invention, there is provided a semiconductor device including: an insulating substrate including an insulating plate and a circuit plate; a semiconductor chip that has a front surface on which an electrode is formed and a rear surface which is fixed to the circuit plate; a printed circuit board that includes a metal layer and faces the insulating substrate; a conductive bonding material that is provided on the electrode; and a conductive post that has a leading end which is electrically and mechanically connected to the electrode through the bonding material and a base portion which is electrically and mechanically connected to the metal layer. In the conductive post, a wetting angle of a surface of the leading end with respect to the molten bonding material is less than the wetting angle of a surface of a central portion.

Effect of the Invention

According to the above-mentioned structure, the wettability of the leading end or the central portion of the conductive post is controlled. Therefore, when the bonding material is melted by a reflow process, the arrangement of the bonding material can be limited in a predetermined range of the leading end of the conductive post. Thus, it is possible to suppress the rise of the bonding material to the conductive post due to the capillary phenomenon. As a result, it is possible to suppress thermal stress due to the difference between the linear expansion coefficients of the bonding material and the conductive post and thus to improve reliability.

BRIEF DESCRIPTION OF DRAWINGS

FIGS. 1(a) and 1(b) illustrate a semiconductor device according to the first embodiment, wherein FIG. 1(a) is a plan view thereof and FIG. 1(b) is a cross-sectional view thereof taken along the line I-I in FIG. 1(a);

FIGS. 3(a) and 3(b) illustrate a semiconductor device according to the second embodiment of the invention, wherein FIG. 3(a) is a plan view thereof and FIG. 3(b) is a cross-sectional view thereof taken along the line III-III in FIG. 3(a);

FIGS. 5(a) and 5(b) illustrate a semiconductor device according to the related art, wherein FIG. 5(a) is a plan view thereof and FIG. 5(b) is a cross-sectional view thereof taken along the line V-V in FIG. 5(a);

MODE(S) FOR CARRYING OUT THE INVENTION

Figure 1A:
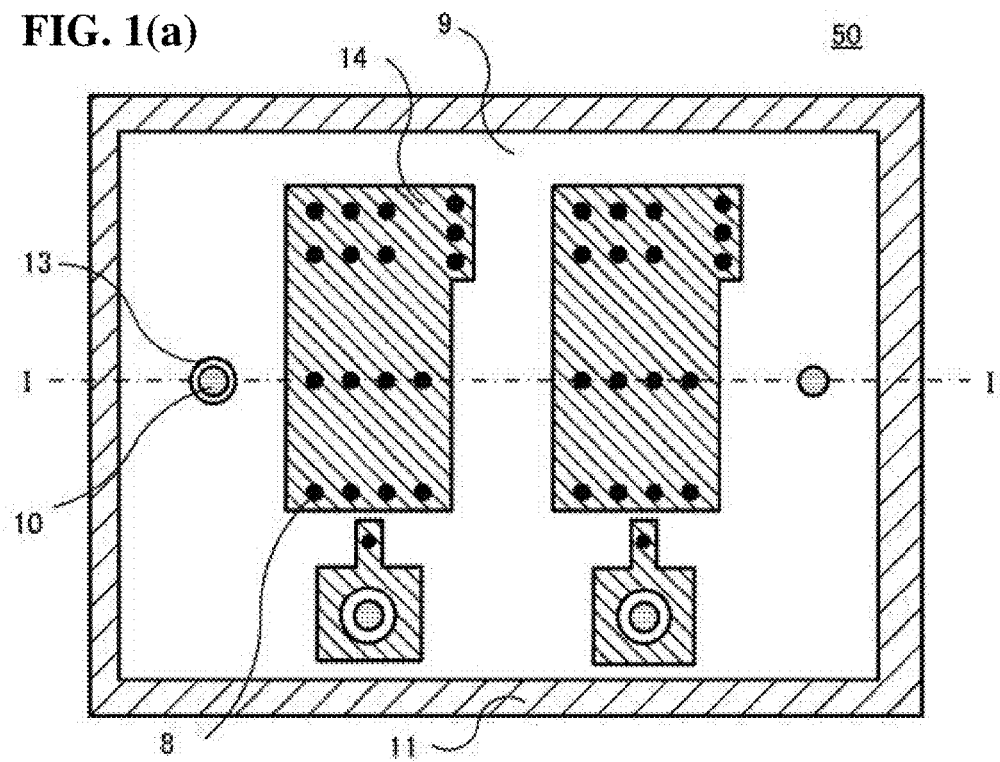

Hereinafter, preferred embodiments (examples) of the invention will be described with reference to the drawings.

In the embodiments, the same components are denoted by the same reference numerals and the description thereof will not be repeated. In addition, the term "electrically and mechanically connected" described in the specification and the claims of the application is not limited to a case in which objects are connected to each other by direct bonding and includes a case in which objects are connected to each other through a conductive bonding material such as solder or a sintered metal material.

(First Embodiment)

A first embodiment of the invention will be described with reference to FIGS. 1(a)-2(b).

Figure 1B:
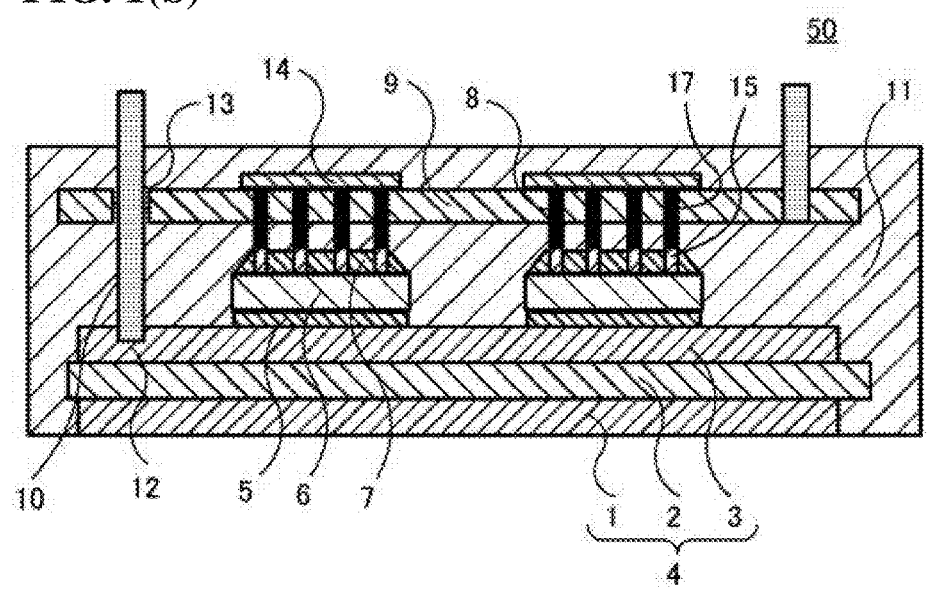

FIGS. 1(a), 1(b) are diagrams illustrating the structure of a power semiconductor module 50 according to the first embodiment of the invention. FIG. 1(a) is a plan view illustrating a main portion and FIG. 1(b) is a cross-sectional view illustrating the main portion taken along the line I-I.

The power semiconductor module 50 includes an insulating substrate 4, semiconductor chips 6, a printed circuit board 9, a bonding material 7, and conductive posts 8. In addition, the power semiconductor module 50 includes external terminals 10 and is integrally formed by a sealing resin 11.

The insulating substrate 4 includes a metal plate 1, an insulating plate 2, and a circuit plate 3. The metal plate 1 and the circuit plate 3 are made of a metal material, such as copper or aluminum, or an alloy having the metal materials as main components. The insulating plate 2 is made of a ceramic material, such as an alumina ($Al_2O_3$) sintered body or a silicon nitride ($Si_3N_4$). The insulating substrate 4 is, for example, a direct copper bonding (DCB) substrate. The circuit plate 3 is selectively patterned in the front surface of the insulating plate 2.

The semiconductor chip 6 is, for example, a vertical power semiconductor chip, such as an insulated gate bipolar transistor (IGBT), a power MOSFET, or a free wheeling diode.

The semiconductor chip 6 is fixed to the circuit plate 3 by a conductive bonding material 5 such as Sn—Ag solder. A rear electrode (for example, a collector electrode) of the semiconductor chip 6 is electrically connected to the circuit plate 3. An electrode 6' is formed at a front surface of the semiconductor chip 6.

The printed circuit board 9 includes a metal layer 14 which is used as a wiring member of the power semiconductor module. The printed circuit board 9 is made of, for example, a polyimide resin. A glass cloth formed by glass fiber may be impregnated into the printed circuit board 9, if necessary. The metal layer 14 is made of, for example, copper or copper alloy.

In addition, a plurality of holes, each having a plated layer (not illustrated) formed on the inner wall, is provided in the printed circuit board 9. The cylindrical conductive post 8 is implanted in the hole, with the plated layer interposed therebetween. According to this structure, it is possible to vertically fix the conductive post 8 to the main surface of the printed circuit board 9. A base portion 17 of the conductive post 8 is electrically and mechanically connected to the metal layer 14. In the power semiconductor module 50, the wiring between the front electrode of the semiconductor chip 6 and the outside is performed by the conductive post 8 and the metal layer 14.

The conductive post 8 is made of, for example, copper or aluminum (Al), or an alloy having the metal materials as the main components. The conductive posts 8 connected to each semiconductor chip 6 have the same length. It is preferable that the surface of the conductive post 8 be plated with copper or copper and nickel (Ni).

The bonding material 7 has the characteristics to be conductive, melt at a melting point, and solidify at a temperature equal to or lower than the melting point. For example, the bonding material 7 is Sn—Ag-based or Ag—Sn-based lead-free solder. Since the bonding material 7 has the characteristics to melt at a temperature equal to or higher than the melting point and to solidify at a temperature equal to or lower than the melting point, it is possible to bond the members to be bonded using a reflow process. In addition, since the bonding material 7 is conductive, it is possible to electrically and mechanically connect a leading end 15 of the conductive post 8 to the front electrode of the semiconductor chip 6.

In addition, the power semiconductor module 50 includes the external terminal 10 that is fitted to a concave portion 12 provided in the circuit plate 3 and is electrically and mechanically connected to the circuit plate 3. The external terminal 10 is inserted into a through hole 13 provided in the printed circuit board 9 and also functions as a positioning member of the printed circuit board 9. In addition, since the external terminal 10 is fixed by a combination of fitting to the concave portion 12 and a bonding material (not illustrated), bonding strength with the circuit plate 3 is ensured.

In addition, the sealing resin 11 made of, for example, an epoxy resin is provided around the above-mentioned components in order to protect the above-mentioned components from an external environment.

Figure 2A:
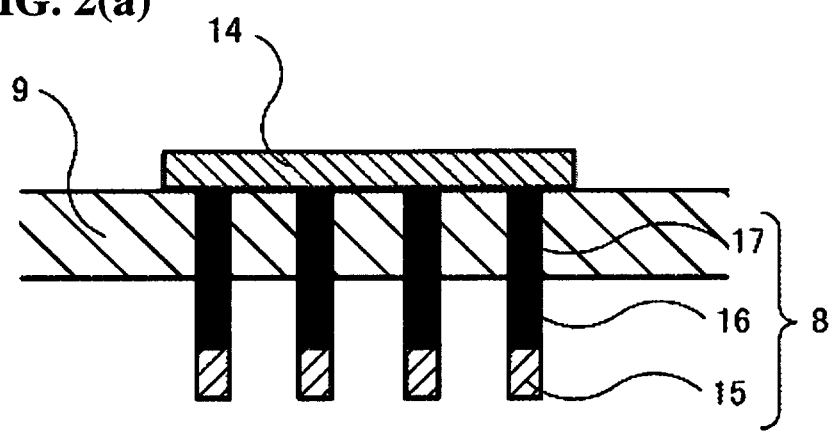
FIGS. 2(a) and 2(b) are enlarged cross-sectional views illustrating the vicinity of a conductive post according to the first embodiment of the invention before and after bonding, respectively.
Figure 2B:
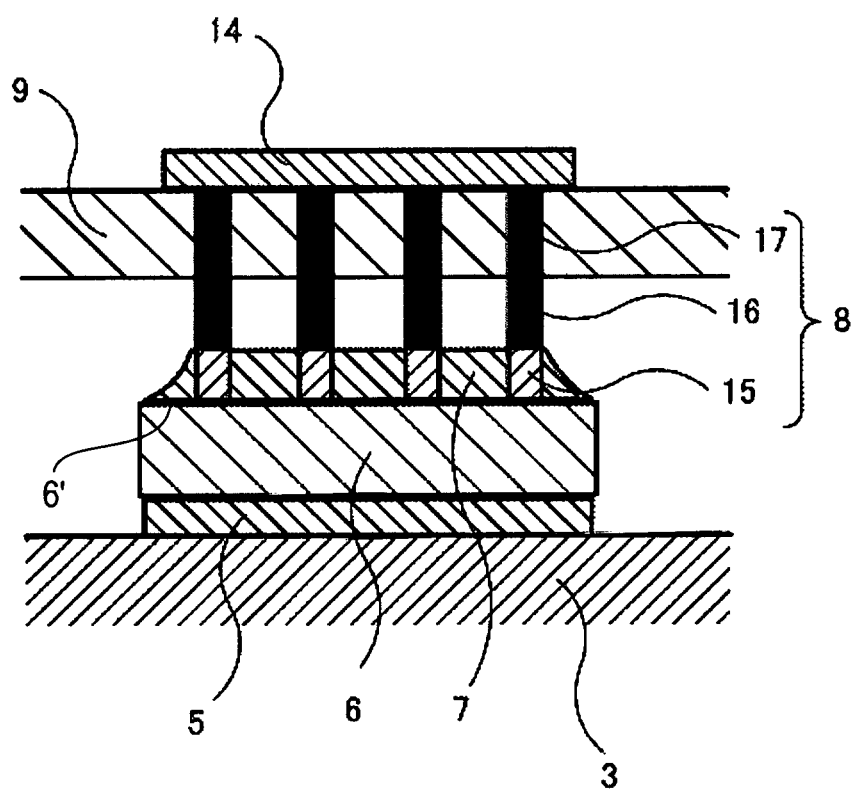

The first embodiment differs from the above-mentioned related art in that the surface of the leading end 15 of the conductive post 8 which contacts the semiconductor chip 6 is covered with a plated layer with a higher wettability than the surface of a central portion 16, which is illustrated in detail in FIGS. 2(*a*), 2(*b*).

Since the surface of the leading end 15 of the conductive post 8 is covered with the plated layer with a higher wettability than the surface of the central portion 16 (FIG. 2(*a*)), the wetting angle of the leading end 15 of the conductive post 8 with respect to the molten bonding material 7 is less than that of the central portion 16 which is not covered with the plated layer or which is covered with a Ni-plated layer. Therefore, when the bonding material 7 is melted by a reflow process, the molten bonding material 7 selectively wets the leading end 15 of the conductive post 8. As a result, it is possible to limit the height of the bonding material 7 to a predetermined value from the semiconductor chip 6 and to suppress the rise of the surface of the bonding material 7 due to a capillary phenomenon (FIG. 2(*b*)). Therefore, it is possible to suppress thermal stress which is applied to the semiconductor chip 6 due to the difference between the linear expansion coefficients of the bonding material 7 and the conductive post 8 and thus to improve the reliability of the power semiconductor module.

As described above, the surface of the conductive post 8 is plated with Cu, or Cu and Ni. However, the leading end 15 according to this example is preferably plated with metal such as Ag or Au. This is because the wettability of the Ag-plated or Au-plated surface to the bonding material, such as solder, is higher than that of the Cu-plated or Ni-plated surface (that is, the wetting angle of the Ag-plated or Au-plated surface is less than that of the Cu-plated or Ni-plated surface).

(Second Embodiment)

A second embodiment of the invention will be described with reference to FIGS. 3(*a*)-4(*b*).

Figure 3A:
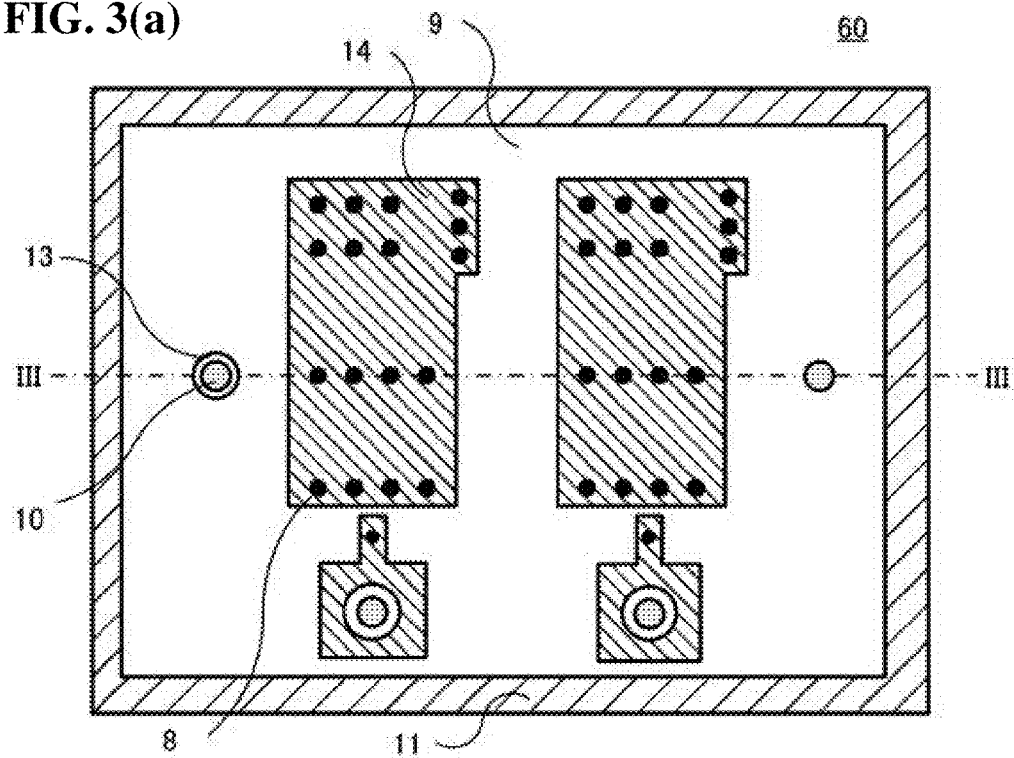
Figure 3B:
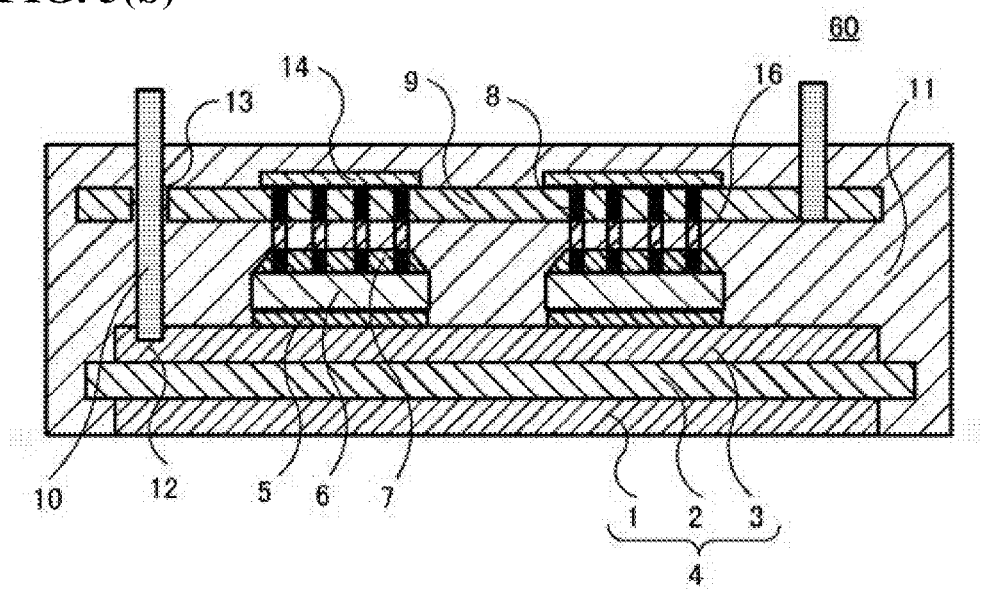

FIGS. 3(*a*), 3(*b*) are diagrams illustrating the structure of a power semiconductor module 60 according to the second embodiment of the invention. FIG. 3(*a*) is a plan view illustrating a main portion and FIG. 3(*b*) is a cross-sectional view illustrating the main portion taken along the line III-III in FIG. 3(*a*).

Figure 4A:
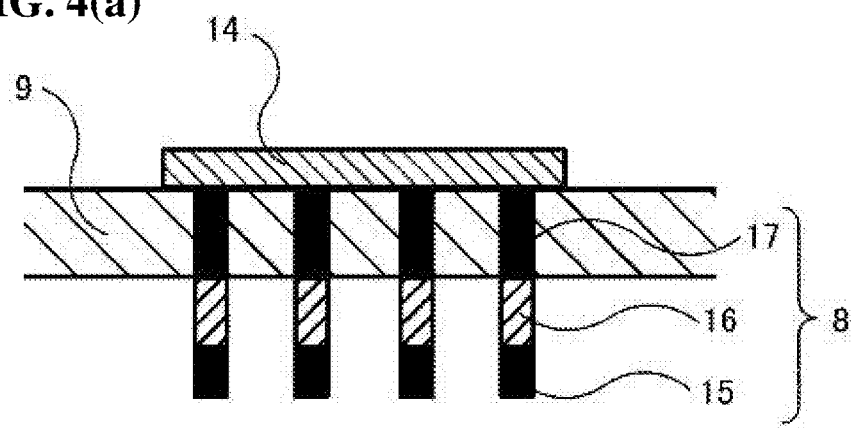
FIGS. 4(a) and 4(b) are enlarged cross-sectional views illustrating the vicinity of a conductive post according to the second embodiment of the invention before and after bonding, respectively.
Figure 4B:
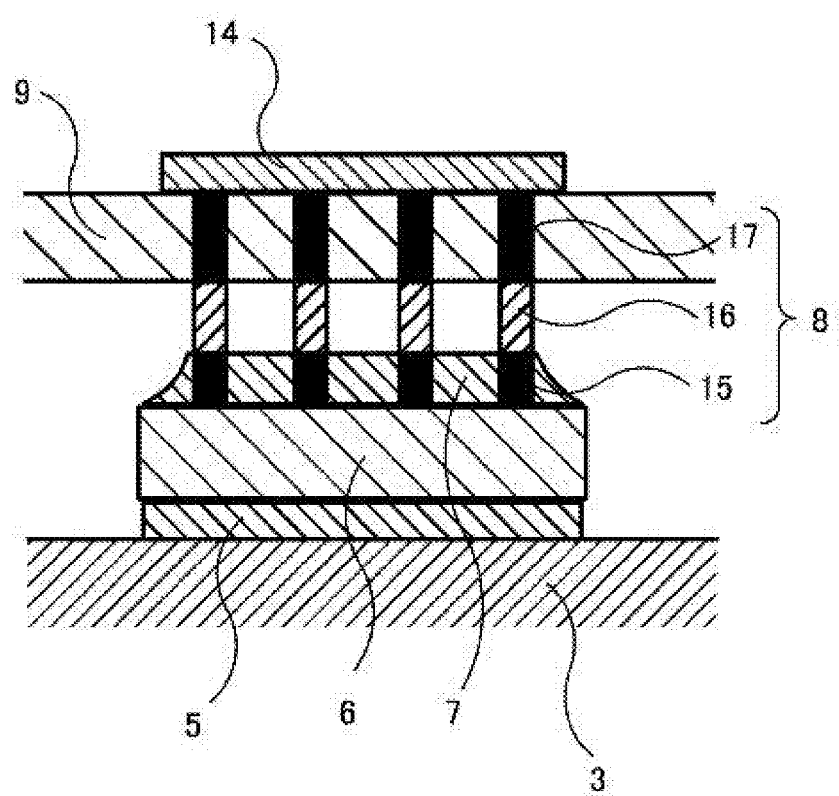
Figure 5A:
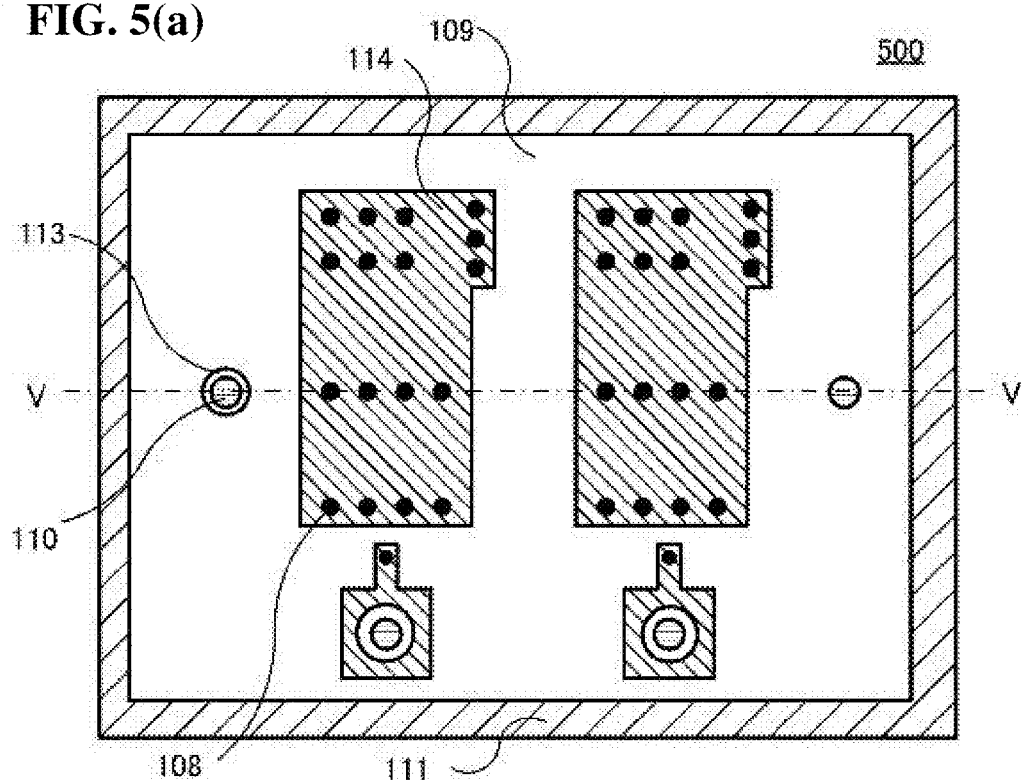
Figure 5B:
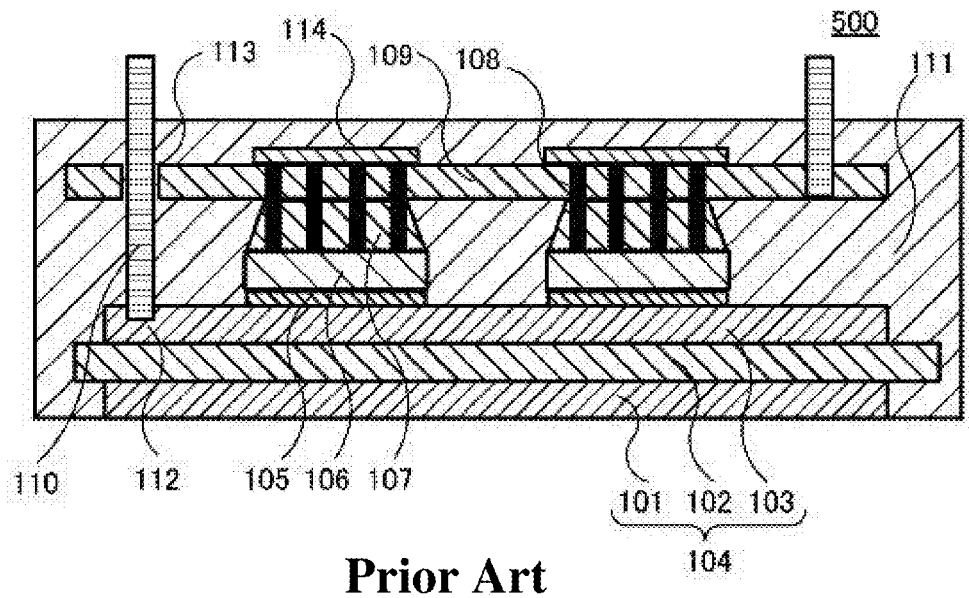
Figure 6A:
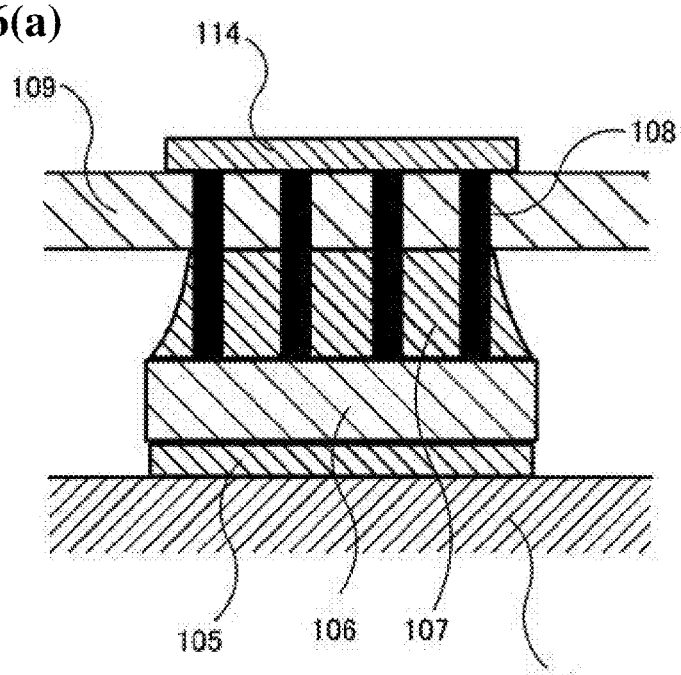
FIGS. 6(a), 6(b) are enlarged cross-sectional views illustrating the vicinity of a conductive post according to the related art.
Figure 6B:
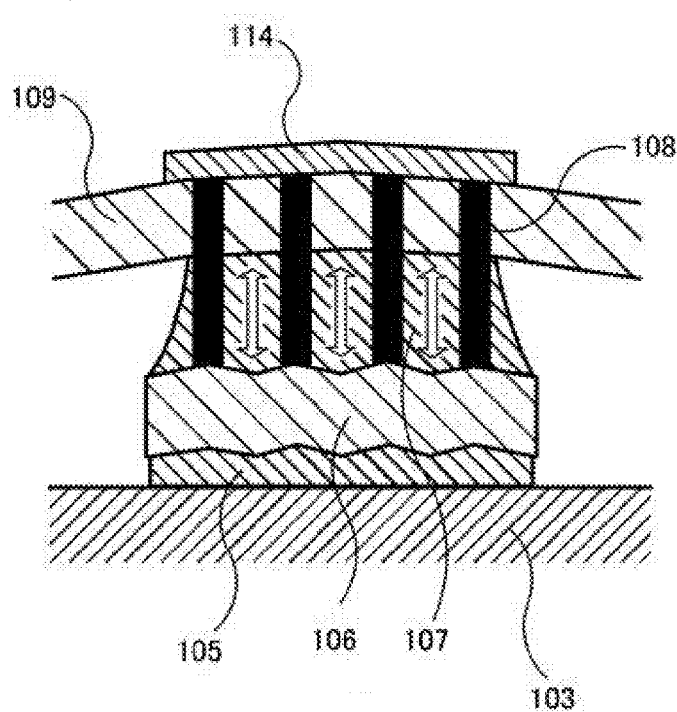
Figure 7A:
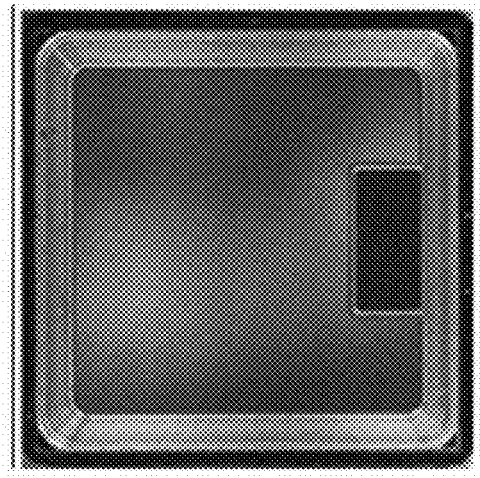
FIGS. 7(a) and 7(b) illustrate the photographs of the surface of a semiconductor chip which indicate the results before and after a reliability test according to the related art, respectively.
Figure 7B:
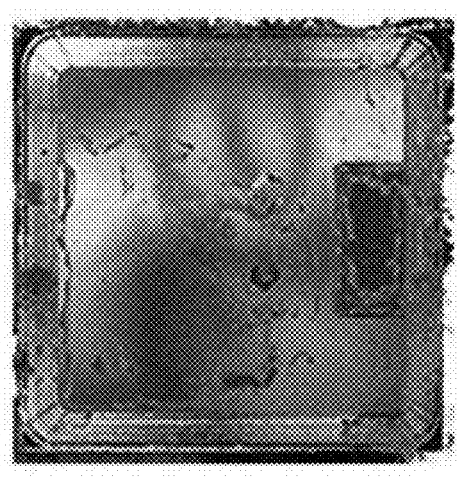

The second embodiment differs from the related art in that the surface of a central portion 16 of a conductive post 8 is covered with a partial mask with a lower wettability than a leading end 15, which is illustrated in detail in FIGS. 4(*a*), 4(*b*).

Since only the surface of the central portion 16 of the conductive post 8 is covered with the partial mask (FIG. 4(*a*)), the wetting angle of the central portion 16 of the conductive post 8 with respect to a molten bonding material 7 is greater than that of the leading end 15 which is not covered with the partial mask. Therefore, when the bonding material 7 is melted by a reflow process, the molten bonding material 7 selectively wets the leading end 15 of the conductive post 8. Therefore, similarly to the first embodiment, it is possible to suppress the rise of the bonding material 7 due to the capillary phenomenon (FIG. 4(*b*)). As a result, it is possible to suppress thermal stress due to the difference between the linear expansion coefficients of the bonding material 7 and the conductive post 8 and thus to improve the reliability of the power semiconductor module.

The partial mask which covers the central portion 16 of the conductive post 8 is, for example, an oxide film formed by laser irradiation or a resin film such as a polyimide film. In addition, the surface of the central portion 16 may be roughened by a mechanical method to limit wetting.

The embodiments of the semiconductor device according to the invention have been described with reference to the drawings. However, the semiconductor device according to the invention is not limited to the embodiments and the drawings and various modifications and changes of the invention can be made without departing from the scope and spirit of the invention.

EXPLANATIONS OF LETTERS OR NUMERALS

1 METAL PLATE
2 INSULATING PLATE
3 CIRCUIT PLATE
4 INSULATING SUBSTRATE
5 BONDING MATERIAL
6 SEMICONDUCTOR CHIP
7 BONDING MATERIAL
8 CONDUCTIVE POST
9 PRINTED CIRCUIT BOARD
10 EXTERNAL TERMINAL
11 SEALING RESIN
12 CONCAVE PORTION
13 THROUGH HOLE
14 METAL LAYER
15 LEADING END
16 CENTRAL PORTION
17 BASE PORTION
50, 60 POWER SEMICONDUCTOR MODULE

What is claimed is:

1. A semiconductor device comprising:
   an insulating substrate including an insulating plate and a circuit plate;
   a semiconductor chip having a front surface formed with an electrode and a rear surface fixed to the circuit plate;
   a printed circuit board including a metal layer, and facing the insulating substrate;
   a conductive bonding material disposed on the electrode; and
   a conductive post having a leading end portion with an Ag plated layer thereon and electrically and mechanically connected to the electrode through the bonding material, a base portion electrically and mechanically connected to the metal layer, and a central portion between the leading end portion and the base portion, the central portion only having a partial mask on a surface thereof so that a wetting angle on a surface of the leading end portion with respect to the molten bonding material is less than that on the surface of the central portion.

2. The semiconductor device according to claim 1, wherein the bonding material is a solder.

3. The semiconductor device according to claim 1, wherein the surface of the central portion of the conductive post is covered with an oxide film or a resin film.

4. The semiconductor device according to claim 1, wherein the surface of the central portion of the conductive post is uneven.

5. The semiconductor device according to claim 1, wherein the printed circuit board includes a plurality of holes, each having a plated layer on an inner wall thereof, the conductive post being implanted in one of the holes with the plated layer interposed therebetween so that the conductive post is vertically fixed to a main surface of the printed circuit board and the base portion of the conductive post is electrically and mechanically connected to the metal layer.

6. A semiconductor device comprising:
   an insulating substrate including an insulating plate and a circuit plate;
   a semiconductor chip having a front surface formed with an electrode and a rear surface fixed to the circuit plate;
   a printed circuit board including a metal layer, and facing the insulating substrate;
   a conductive bonding material disposed on the electrode; and
   a conductive post having a leading end portion with an Ag plated layer thereon and electrically and mechanically connected to the electrode through the bonding material, a base portion electrically and mechanically connected to the metal layer, and a central portion between the leading end portion and the base portion, the leading end portion with the Ag plated layer having a higher wettability than a surface of the central portion so that a wetting angle on a surface of the leading end portion with respect to the molten bonding material is less than that on the surface of the central portion.

7. The semiconductor device according to claim 6, wherein the surface of the central portion and a surface of the base portion are plated with Cu, or Cu and Ni.

8. The semiconductor device according to claim 7, wherein the printed circuit board includes a plurality of holes, each having a plated layer on an inner wall thereof, the conductive post being implanted in one of the holes with the plated layer interposed therebetween so that the conductive post is vertically fixed to a main surface of the printed circuit board and the base portion of the conductive post is electrically and mechanically connected to the metal layer.

* * * * *